(12) United States Patent
Ji et al.

(10) Patent No.: US 12,336,139 B2
(45) Date of Patent: Jun. 17, 2025

(54) SERVER DEVICE AND COOLING APPARATUS

(71) Applicants: INVENTEC (PUDONG) TECHNOLOGY CORPORATION, Shanghai (CN); INVENTEC CORPORATION, Taipei (TW)

(72) Inventors: Jiaqing Ji, Shanghai (CN); Jiang-Jun Wu, Shanghai (CN); Ke Sun, Shanghai (CN)

(73) Assignees: INVENTEC (PUDONG) TECHNOLOGY CORPORATION, Shanghai (CN); INVENTEC TECHNOLOGY CORPORATION, Taipei (TW)

( * ) Notice: Subject to any disclaimer, the term of this patent is extended or adjusted under 35 U.S.C. 154(b) by 260 days.

(21) Appl. No.: 18/209,834

(22) Filed: Jun. 14, 2023

(65) Prior Publication Data

US 2024/0407131 A1    Dec. 5, 2024

(30) Foreign Application Priority Data

Jun. 5, 2023 (CN) .......................... 202310655456.0

(51) Int. Cl.
*H05K 7/20* (2006.01)

(52) U.S. Cl.
CPC ..... *H05K 7/20272* (2013.01); *H05K 7/20772* (2013.01)

(58) Field of Classification Search
CPC combination set(s) only.
See application file for complete search history.

(56) References Cited

U.S. PATENT DOCUMENTS

| | | | | |
|---|---|---|---|---|
| 11,129,305 | B2* | 9/2021 | Raeth | H05K 7/20409 |
| 11,980,011 | B2* | 5/2024 | Edmunds | H05K 7/20254 |
| 2015/0062817 | A1* | 3/2015 | Lin | H05K 7/20772 |
| | | | | 361/720 |
| 2015/0070844 | A1* | 3/2015 | Chang | H05K 7/20636 |
| | | | | 165/104.34 |
| 2023/0063953 | A1* | 3/2023 | Chen | H01L 23/473 |
| 2023/0284413 | A1* | 9/2023 | Zhu | G06F 1/20 |
| | | | | 361/679.46 |
| 2024/0215199 | A1* | 6/2024 | Zhang | H05K 7/20272 |
| 2024/0230151 | A1* | 7/2024 | Chen | F24F 11/89 |
| 2024/0407131 | A1* | 12/2024 | Ji | H05K 7/20781 |

* cited by examiner

*Primary Examiner* — Lisa Lea-Edmonds
(74) *Attorney, Agent, or Firm* — Maschoff Brennan

(57) ABSTRACT

A server device includes a casing, a flow equalizing plate and a server. The casing has an accommodating space, a liquid inlet and a liquid outlet. The accommodating space accommodates a cooling liquid. The accommodating space is in fluid communication with the liquid inlet and the liquid outlet. The flow equalizing plate is detachably located in the accommodating space. The flow equalizing plate divides the accommodating space into an upper subspace and a lower subspace. The flow equalizing plate has through holes. The through holes are in fluid communication with the upper subspace and the lower subspace. The liquid inlet is in fluid communication with the lower subspace. The liquid outlet is in fluid communication with the upper subspace. The server is located in the upper subspace. The liquid inlet and the liquid outlet are in fluid communication with the server. Sizes of the through holes are different.

10 Claims, 5 Drawing Sheets

SERVER DEVICE AND COOLING APPARATUS

CROSS-REFERENCE TO RELATED APPLICATIONS

This non-provisional application claims priority under 35 U.S.C. § 119(a) on Patent Application No(s). 202310655456.0 filed in China, on Jun. 5, 2023, the entire contents of which are hereby incorporated by reference.

BACKGROUND OF THE INVENTION

Technical Field of the Invention

The invention relates to a server device and a cooling apparatus, more particularly to a server device and a cooling apparatus having flow equalizing plates.

Description of the Related Art

With the arrival of the big data era and the continuous development of cloud technology, the requirements for high performance servers are higher than ever, and the amount of the data processed by the servers is increasing. Accordingly, the density of heat transferring at the servers rapidly increases, and heat generated thereby also increases massively. Therefore, the problem of heat dissipation needs to be solved urgently.

The high performance servers may be cooled by a liquid cooling system so as to maintain the performance and prolong the lifespan. Generally, the liquid cooling system is provided with a flow equalizing plate therein for allowing cooling liquid flowing through each server via the flow equalizing plate to absorb heat. However, the flows able to be flown in a convention flow equalizing plate are too uneven to absorb heat from each server averagely, thereby causing accumulated heat to affect the performance of the server. Thus, the heat dissipation requirement cannot be met. Therefore, how to provide even cooling liquid to rapidly dissipate heat from the server more is an important issue to be solved.

SUMMARY OF THE INVENTION

The invention provides a server device and a cooling apparatus, which provides even cooling liquid to rapidly dissipate heat from the server more.

One embodiment of the invention provides a server device including a casing, at least one flow equalizing plate and at least one server. The casing has an accommodating space, at least one liquid inlet and at least one liquid outlet. The accommodating space is configured to accommodate a cooling liquid. The accommodating space is in fluid communication with the at least one liquid inlet and the at least one liquid outlet. The at least one flow equalizing plate is detachably located in the accommodating space. The at least one flow equalizing plate divides the accommodating space into an upper subspace and a lower subspace. The at least one flow equalizing plate has a plurality of through holes. The plurality of through holes are in fluid communication with the upper subspace and the lower subspace. The at least one liquid inlet is in fluid communication with the lower subspace. The at least one liquid outlet is in fluid communication with the upper subspace. The at least one server is located in the upper subspace. The at least one liquid inlet and the at least one liquid outlet are in fluid communication with the at least one server. Sizes of the plurality of through holes of the at least one flow equalizing plate are different.

Another embodiment of the invention provides a cooling apparatus including a casing and at least one flow equalizing plate. The casing has an accommodating space, at least one liquid inlet and at least one liquid outlet. The accommodating space is configured to accommodate a cooling liquid. The at least one liquid inlet and the at least one liquid outlet are configured to be in fluid communication with a fluid driving apparatus and at least one server. The accommodating space is in fluid communication with the at least one liquid inlet and the at least one liquid outlet. The at least one flow equalizing plate divides the accommodating space into an upper subspace and a lower subspace. The at least one flow equalizing plate has a plurality of through holes. The plurality of through holes are in fluid communication with the upper subspace and the lower subspace. The at least one liquid inlet is in fluid communication with the lower subspace. The at least one liquid outlet is in fluid communication with the upper subspace. Sizes of the plurality of through holes of the at least one flow equalizing plate are different.

According to the server device and the cooling apparatus disclosed by above embodiments, since the sizes of the plurality of through holes of the flow equalizing plate are different, the cooling liquid can flow through the server more evenly. Accordingly, it can dissipate heat from the server more evenly so as to maintain the operation of the server.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

Figure 1:
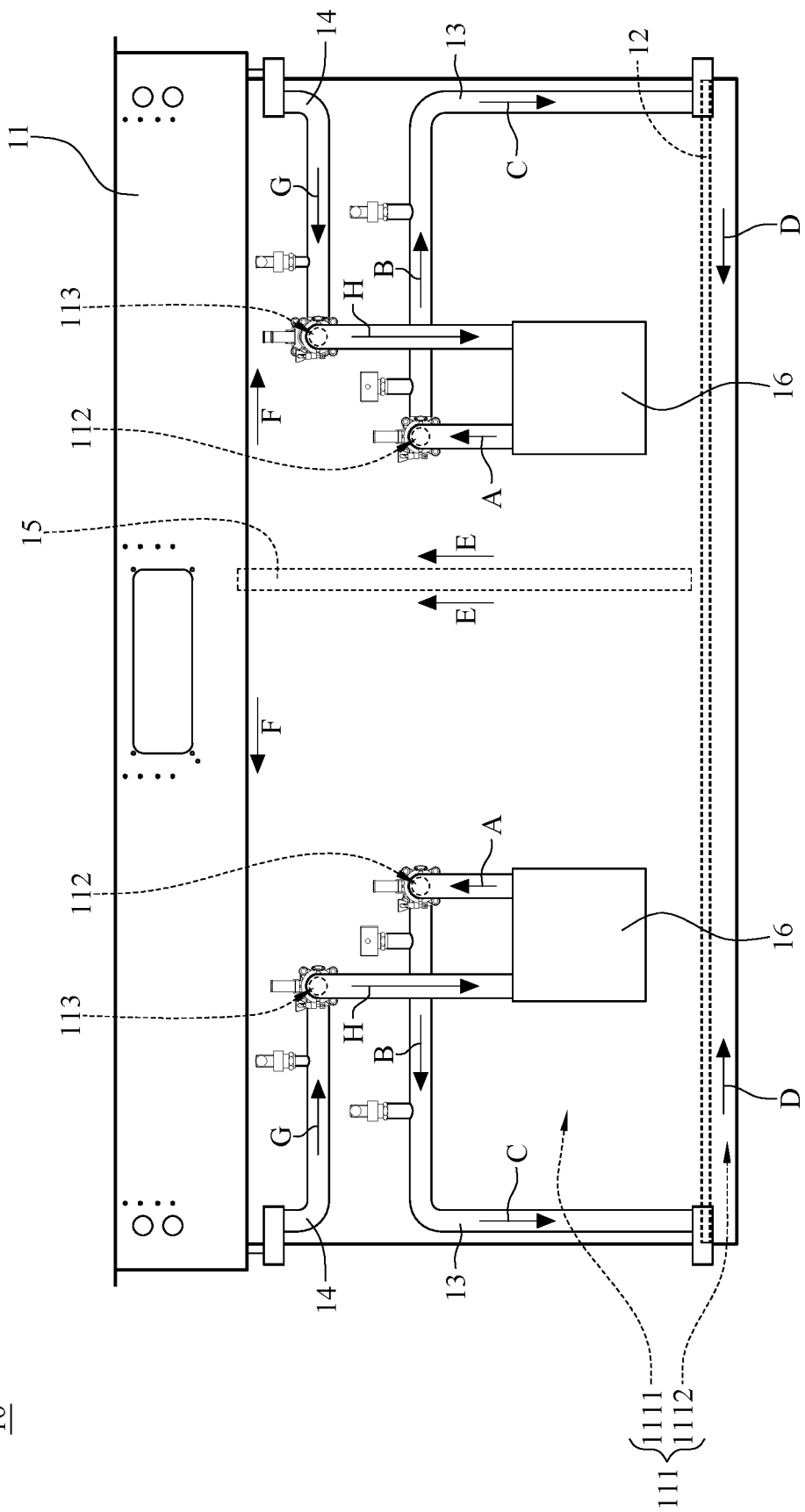
FIG. 1 is a front view of a server device in accordance with a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
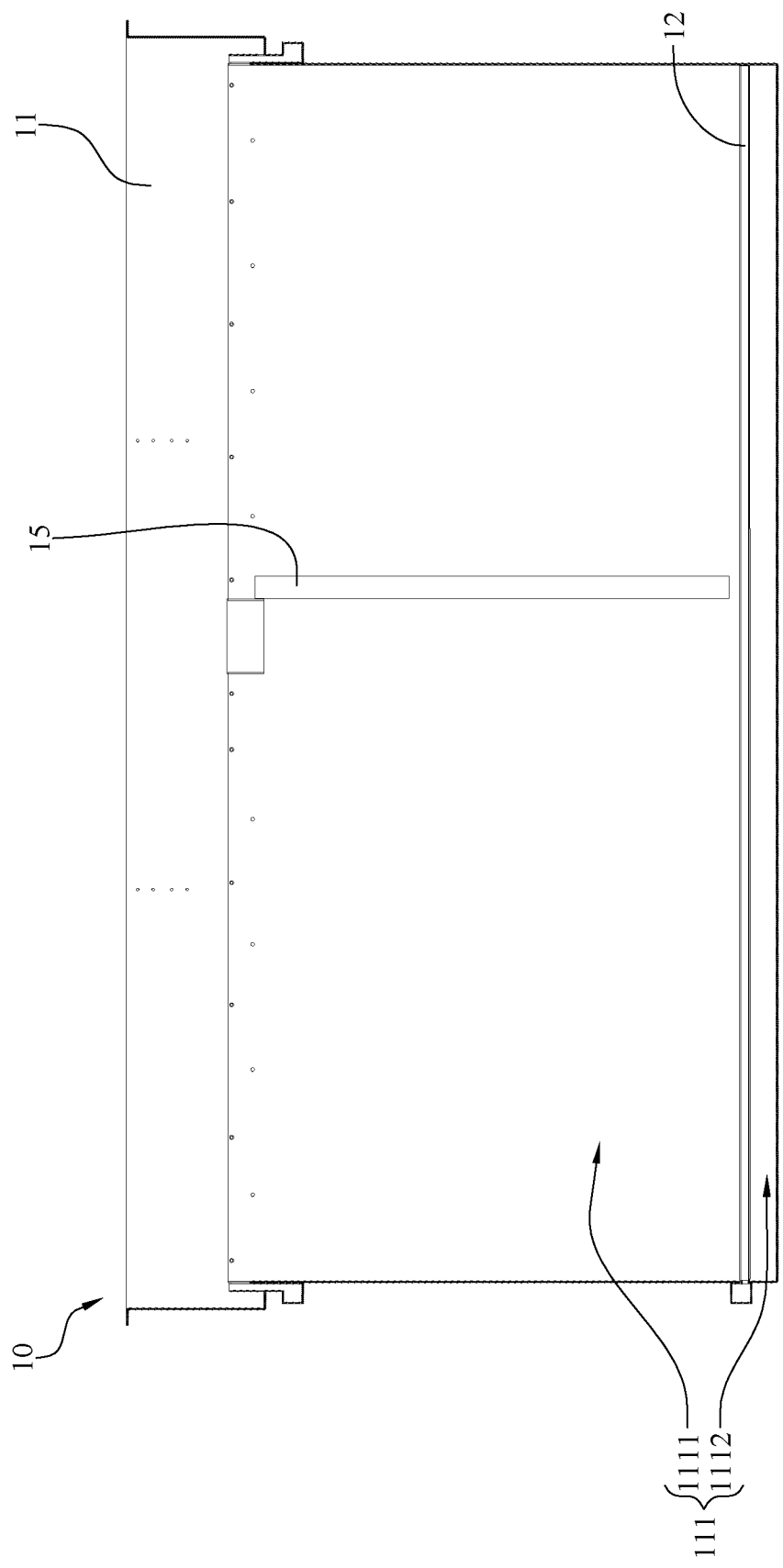
FIG. 2 is a cross-sectional view of the server device in FIG. 1.

Please refer to FIG. 1 and FIG. 2, where FIG. 1 is a front view of a server device in accordance with a first embodiment of the invention, and FIG. 2 is a cross-sectional view of the server device 10 in FIG. 1.

In this embodiment, the server device 10 includes a casing 11, a flow equalizing plate 12, two liquid inlet pipes 13, two liquid outlet pipes 14, a server 15 and two fluid driving apparatuses 16. The casing 11 has an accommodating space 111, two liquid inlets 112 and two liquid outlets 113. The accommodating space 111 is configured to accommodate a cooling liquid (not shown), and is in fluid communication with the two liquid inlets 112 and the two liquid outlets 113.

Figure 3:
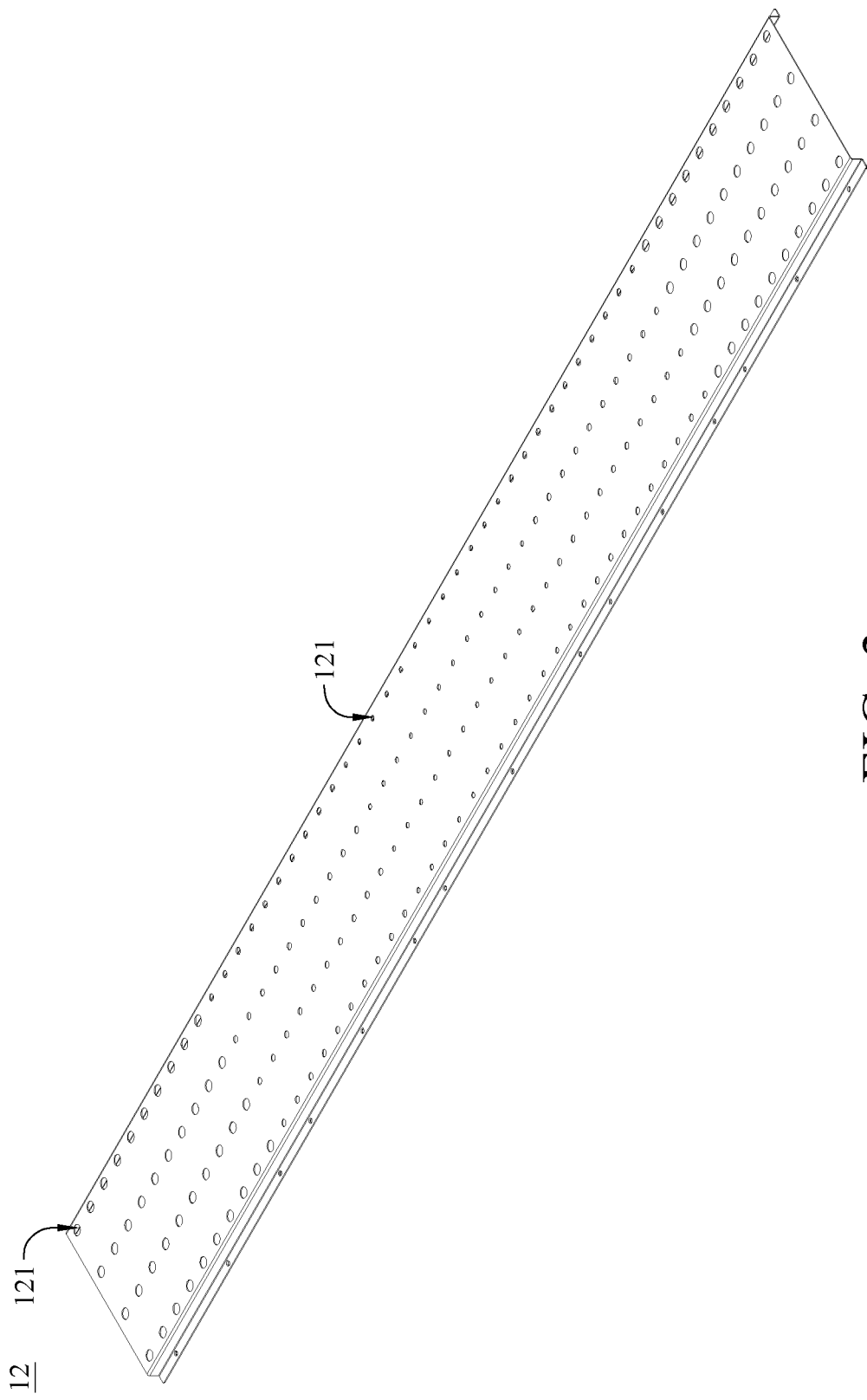
FIG. 3 is a perspective view of a flow equalizing plate of the server device in FIG. 1.
Figure 4:
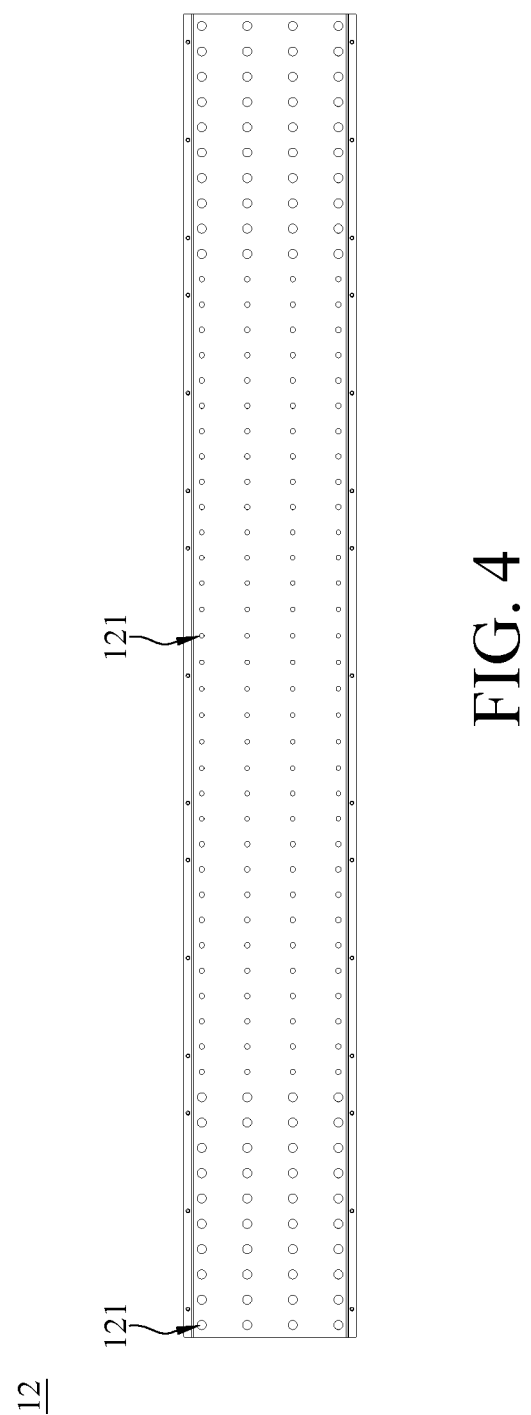
FIG. 4 is a top view of the flow equalizing plate of the server device in FIG. 1.

Please further refer to FIG. 3 and FIG. 4 with FIGS. 1-2 together, where FIG. 3 is a perspective view of the flow equalizing plate 12 of the server device 10 in FIG. 1, and FIG. 4 is a top view of the flow equalizing plate 12 of the server device 10 in FIG. 1.

The flow equalizing plate 12 is detachably located in the accommodating space 111, and divides the accommodating space 111 into an upper subspace 1111 and a lower subspace 1112. The two liquid inlets 112 is in fluid communication with the lower subspace 1112 via the two liquid inlet pipes 13. The two liquid outlets 113 is in fluid communication with the upper subspace 1111 via the two liquid outlet pipes 14. The two liquid inlets 112, the two liquid outlets 113, the two liquid inlet pipes 13 and the two liquid outlet pipes 14 are arranged symmetrically, respectively. The flow equalizing plate 12 has a plurality of through holes 121. The plurality of through holes 121 are in fluid communication with the upper subspace 1111 and the lower subspace 1112. Sizes of the plurality of through holes 121 decrease from opposite ends of the flow equalizing plate 12 towards a center of the flow equalizing plate 12.

The server 15 is located in the upper subspace 1111, and the two liquid inlets 112 and the two liquid outlets 113 are in fluid communication with the server 15. The two fluid driving apparatuses 16 are, for example, pumps. The two liquid inlet pipes 13 and the two liquid outlet pipes 14 are in fluid communication with the two fluid driving apparatuses 16, respectively. The two fluid driving apparatuses 16 can drive the cooling liquid to flow into the two liquid inlet pipes 13 along directions A, B and C, respectively. Then, the cooling liquid flows into the lower subspace 1112 along a direction D. Then, the cooling liquid flows into the upper subspace 1111 after passing through the plurality of through holes 121 of the flow equalizing plate 12, and flows by the server 15 to dissipate heat from the server 15 along a direction E. Then, the cooling liquid flows towards the two liquid outlet pipes 14 in the upper subspace 1111 along a direction F. Finally, the cooling liquid flows into the two liquid outlet pipes 14 along a direction G, and flows back to the two fluid driving apparatuses 16 along a direction H for the next circulation.

In this embodiment, the advantage of the different sizes of the plurality of through holes 121 of the flow equalizing plate 12 is that the cooling liquid can flow through the server more evenly after passing through the plurality of through holes 121 of the flow equalizing plate 12. Accordingly, it can dissipate heat from the server 15 more evenly so as to maintain the operation of the server 15.

In this embodiment, the server device 10 includes one server 15, but the present invention is not limited thereto. In other embodiments, the server device may include two or more servers.

In this embodiment, the casing 11 has two liquid inlets 112 and two liquid outlets 113, the server device 10 includes two liquid inlet pipes 13, two liquid outlet pipes 14 and two fluid driving apparatuses 16, the two liquid inlet pipes 13 are in fluid communication with the two liquid inlets 112 and the two fluid driving apparatuses 16, the two liquid outlet pipes 14 are in fluid communication with the two liquid outlets 113 and the two fluid driving apparatuses 16, and the two liquid inlets 112, the two liquid outlets 113, the two liquid inlet pipes 13 and the two liquid outlet pipes 14 are arranged symmetrically, respectively, but the present invention is not limited thereto. In other embodiments, the casing may have one or more than three liquid inlets and one or more than three liquid outlets, the server device may include one or more than three liquid inlet pipes, one or more than three liquid outlet pipes and one or more than three fluid driving apparatuses, the liquid inlet pipe(s) is/are in fluid communication with the liquid inlet(s) and the fluid driving apparatus(es), and the liquid outlet pipe(s) is/are in fluid communication with the liquid outlet(s) and the fluid driving apparatus(es).

Figure 5:
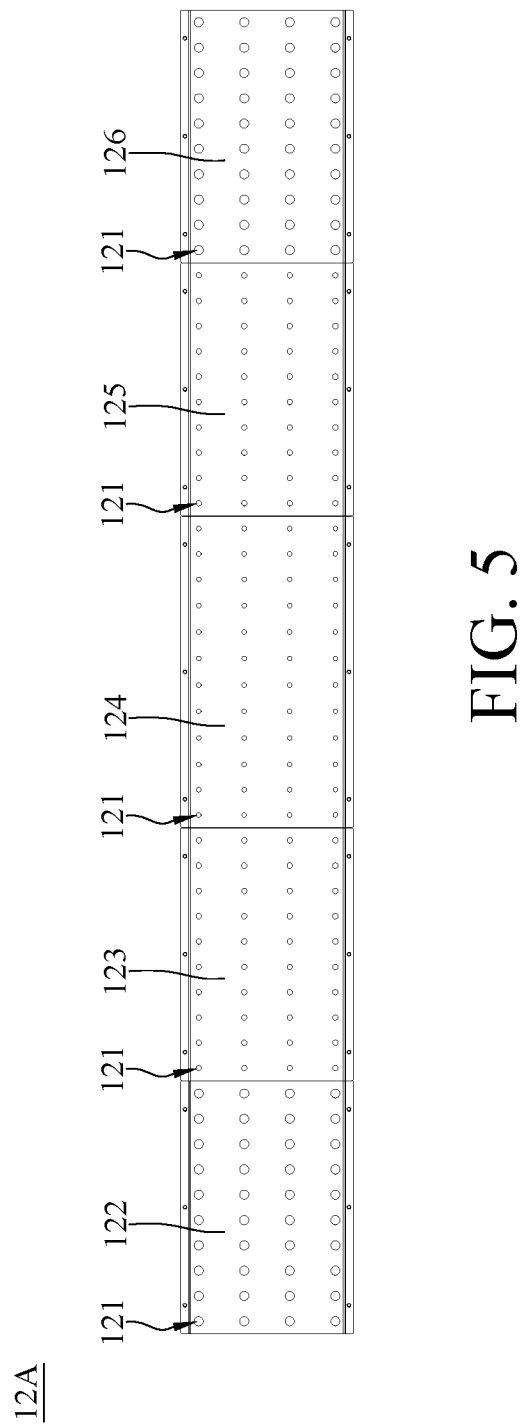
FIG. 5 is a top view of a flow equalizing plate of a server device in accordance with a second embodiment of the invention.

The flow equalizing plate 12 of above embodiments is integrally formed as a single piece, and the flow equalizing plate 12 has a plurality of through holes 121 with different in sizes, but the present invention is not limited thereto. Please refer to FIG. 5, which is a top view of a flow equalizing plate 12A of a server device 10 in accordance with a second embodiment of the invention. The flow equalizing plate 12A of the server device 10 of this embodiment is similar to the flow equalizing plate 12 of the server device 10 of the first embodiment, the main difference between them will be described below, and the same parts between them can be referred to the aforementioned paragraphs with the reference to FIG. 1 to FIG. 4 and will not be repeatedly introduced hereinafter. In this embodiment, the flow equalizing plate 12A includes a first flow equalizing sub-plate 122, a second flow equalizing sub-plate 123, a third flow equalizing sub-plate 124, a fourth flow equalizing sub-plate 125 and a fifth flow equalizing sub-plate 126. The plurality of through holes 121 are disposed through the flow equalizing sub-plates 122-126. Sizes of the plurality of through holes 121 of the flow equalizing sub-plates 122-126 are different. The flow equalizing sub-plates 122-126 are detachably arranged side by side. Accordingly, the flow equalizing sub-plates 122-126 with the plurality of through holes in different sizes can be selected according to the heat dissipation requirements for the server device 10, so that the flow equalizing plate 12A can be used more flexibly, thereby further dissipating heat from the server 15 evenly.

In this embodiment, the flow equalizing plate 12A includes five flow equalizing sub-plates 122-126, the sizes of the plurality of through holes 121 of the five flow equalizing sub-plates 122-126 are different, and the five flow equalizing sub-plates 122-126 are detachably arranged side by side, but the present invention is not limited thereto. In other embodiments, the flow equalizing plate may include less than five or more than five flow equalizing sub-plates, the sizes of the plurality of through holes of the flow equalizing sub-plates are different, and the flow equalizing sub-plates are detachably arranged side by side.

According to the server device and the cooling apparatus disclosed by above embodiments, since the sizes of the plurality of through holes of the flow equalizing plate are different, the cooling liquid can flow through the server more evenly. Accordingly, it can dissipate heat from the server more evenly so as to maintain the operation of the server.

In addition, since the flow equalizing plate is detachably located in the accommodating space and including the plurality of flow equalizing sub-plates with the plurality of through holes in different sizes, which can be selected according to the heat dissipation requirements for the server device, so that the flow equalizing plate can be used more flexibly, thereby further dissipating heat from the server evenly.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:

1. A server device, comprising:
a casing, having an accommodating space, at least one liquid inlet and at least one liquid outlet, wherein the accommodating space is configured to accommodate a cooling liquid, and the accommodating space is in fluid communication with the at least one liquid inlet and the at least one liquid outlet;
at least one flow equalizing plate, detachably located in the accommodating space, wherein the at least one flow equalizing plate divides the accommodating space into an upper subspace and a lower subspace, the at least one flow equalizing plate has a plurality of through holes, the plurality of through holes are in fluid communication with the upper subspace and the lower subspace, the at least one liquid inlet is in fluid communication with the lower subspace, and the at least one liquid outlet is in fluid communication with the upper subspace; and
at least one server, located in the upper subspace, wherein the at least one liquid inlet and the at least one liquid outlet are in fluid communication with the at least one server;
wherein sizes of the plurality of through holes of the at least one flow equalizing plate are different.

2. The server device according to claim 1, further comprising at least one liquid inlet pipe and at least one liquid outlet pipe, wherein the at least one liquid inlet pipe is in fluid communication with the lower subspace via the at least one liquid inlet, and the at least one liquid outlet pipe is in fluid communication with the upper subspace via the at least one liquid outlet.

3. The server device according to claim 2, further comprising a fluid driving apparatus, wherein the at least one liquid inlet pipe and the at least one liquid outlet pipe are in fluid communication with the fluid driving apparatus, respectively, and the fluid driving apparatus drives the cooling liquid to circulate in the casing, the at least one liquid inlet pipe and the at least one liquid outlet pipe.

4. The server device according to claim 2, wherein the casing has two liquid inlets and two liquid outlets, the server device comprises two liquid inlet pipes and two liquid outlet pipes, and the two liquid inlets, the two liquid outlets, the two liquid inlet pipes and the two liquid outlet pipes are arranged symmetrically, respectively.

5. The server device according to claim 1, wherein the sizes of the plurality of through holes decrease from opposite ends of the at least one flow equalizing plate towards a center of the at least one flow equalizing plate.

6. The server device according to claim 1, wherein the at least one flow equalizing plate comprises a first flow equalizing sub-plate and a second flow equalizing sub-plate, the plurality of through holes are disposed through the first flow equalizing sub-plate and the second flow equalizing sub-plate, sizes of the plurality of through holes of the first flow equalizing sub-plate and sizes of the plurality of through holes of the second flow equalizing sub-plate are different, and the first flow equalizing sub-plate and the second flow equalizing sub-plate are detachably arranged side by side.

7. A cooling apparatus, comprising:
a casing, having an accommodating space, at least one liquid inlet and at least one liquid outlet, wherein the accommodating space is configured to accommodate a cooling liquid, the at least one liquid inlet and the at least one liquid outlet are configured to be in fluid communication with a fluid driving apparatus and at least one server, and the accommodating space is in fluid communication with the at least one liquid inlet and the at least one liquid outlet; and
at least one flow equalizing plate, detachably located in the accommodating space, wherein the at least one flow equalizing plate divides the accommodating space into an upper subspace and a lower subspace, the at least one flow equalizing plate has a plurality of through holes, the plurality of through holes are in fluid communication with the upper subspace and the lower subspace, the at least one liquid inlet is in fluid communication with the lower subspace, and the at least one liquid outlet is in fluid communication with the upper subspace;
wherein sizes of the plurality of through holes of the at least one flow equalizing plate are different.

8. The cooling apparatus according to claim 7, further comprising at least one liquid inlet pipe and at least one liquid outlet pipe, wherein the at least one liquid inlet pipe is in fluid communication with the lower subspace via the at least one liquid inlet, and the at least one liquid outlet pipe is in fluid communication with the upper subspace via the at least one liquid outlet.

9. The cooling apparatus according to claim 8, wherein the casing has two liquid inlets and two liquid outlets, the cooling apparatus comprises two liquid inlet pipes and two liquid outlet pipes, and the two liquid inlets, the two liquid outlets, the two liquid inlet pipes and the two liquid outlet pipes are arranged symmetrically, respectively.

10. The cooling apparatus according to claim 7, wherein the at least one flow equalizing plate comprises a first flow equalizing sub-plate and a second flow equalizing sub-plate, the plurality of through holes are disposed through the first flow equalizing sub-plate and the second flow equalizing sub-plate, sizes of the plurality of through holes of the first flow equalizing sub-plate and sizes of the plurality of through holes of the second flow equalizing sub-plate are different, and the first flow equalizing sub-plate and the second flow equalizing sub-plate are detachably arranged side by side.

* * * * *